US012638488B2

(12) United States Patent
Rathsmann

(10) Patent No.: US 12,638,488 B2
(45) Date of Patent: May 26, 2026

(54) METHOD AND DEVICE FOR INSULATION MONITORING AND INSULATION FAULT LOCATION FOR UNEARTHED POWER SUPPLY NETWORKS

(71) Applicant: ESA Elektroschaltanlagen Grimma GmbH, Grimma (DE)

(72) Inventor: Stephan Rathsmann, Potsdam (DE)

(73) Assignee: ESA Elektroschaltanlagen Grimma GmbH (DE)

(*) Notice: Subject to any disclaimer, the term of this patent is extended or adjusted under 35 U.S.C. 154(b) by 187 days.

(21) Appl. No.: 18/679,716

(22) Filed: May 31, 2024

(65) Prior Publication Data

US 2024/0319251 A1     Sep. 26, 2024

Related U.S. Application Data

(63) Continuation of application No. PCT/IB2022/061571, filed on Nov. 30, 2022.

(30) Foreign Application Priority Data

Dec. 1, 2021     (DE) ..................... 10 2021 131 702.9

(51) Int. Cl.
*G01R 31/08*          (2020.01)
*G01R 27/18*          (2006.01)
(52) U.S. Cl.
CPC ........... *G01R 31/086* (2013.01); *G01R 27/18* (2013.01)

(58) Field of Classification Search
CPC ..................................................... G01R 31/08
See application file for complete search history.

(56) References Cited

U.S. PATENT DOCUMENTS

| | | | |
|---|---|---|---|
| 9,952,271 B2 * | 4/2018 | Dalban Pilon | ......... H02H 3/167 |
| 10,126,345 B2 * | 11/2018 | Hackl | ..................... G01R 27/18 |
| 10,598,720 B2 | 3/2020 | Schaefer et al. | |
| 11,789,060 B2 * | 10/2023 | Becker | ................. G01R 31/086 |
| | | | 324/523 |

FOREIGN PATENT DOCUMENTS

DE          102005054544 A1     8/2012

* cited by examiner

*Primary Examiner* — Tung X Nguyen

(57)          ABSTRACT

A method and device for insulation monitoring and insulation fault location in an unearthed power supply network operate without a testing current generator by using an insulation monitoring device to generate a permanent measuring voltage between a mains conductor and earth and to feed a measuring current into the network. Measuring currents are detected using at least one current transformer arranged at each mains outgoing circuit, and total measuring current and proportional measuring currents in the mains outgoing circuits are determined and evaluated such that the measuring current used for insulation monitoring of the overall network is also used for insulation fault location in individual circuits. From a time variation of each circuit measuring current and the measuring voltage, an ohmic insulation resistance and a capacitive reactance (and/or impedance) are determined and analyzed for each mains outgoing circuit.

15 Claims, 4 Drawing Sheets

FIG. 2

Figure 1:
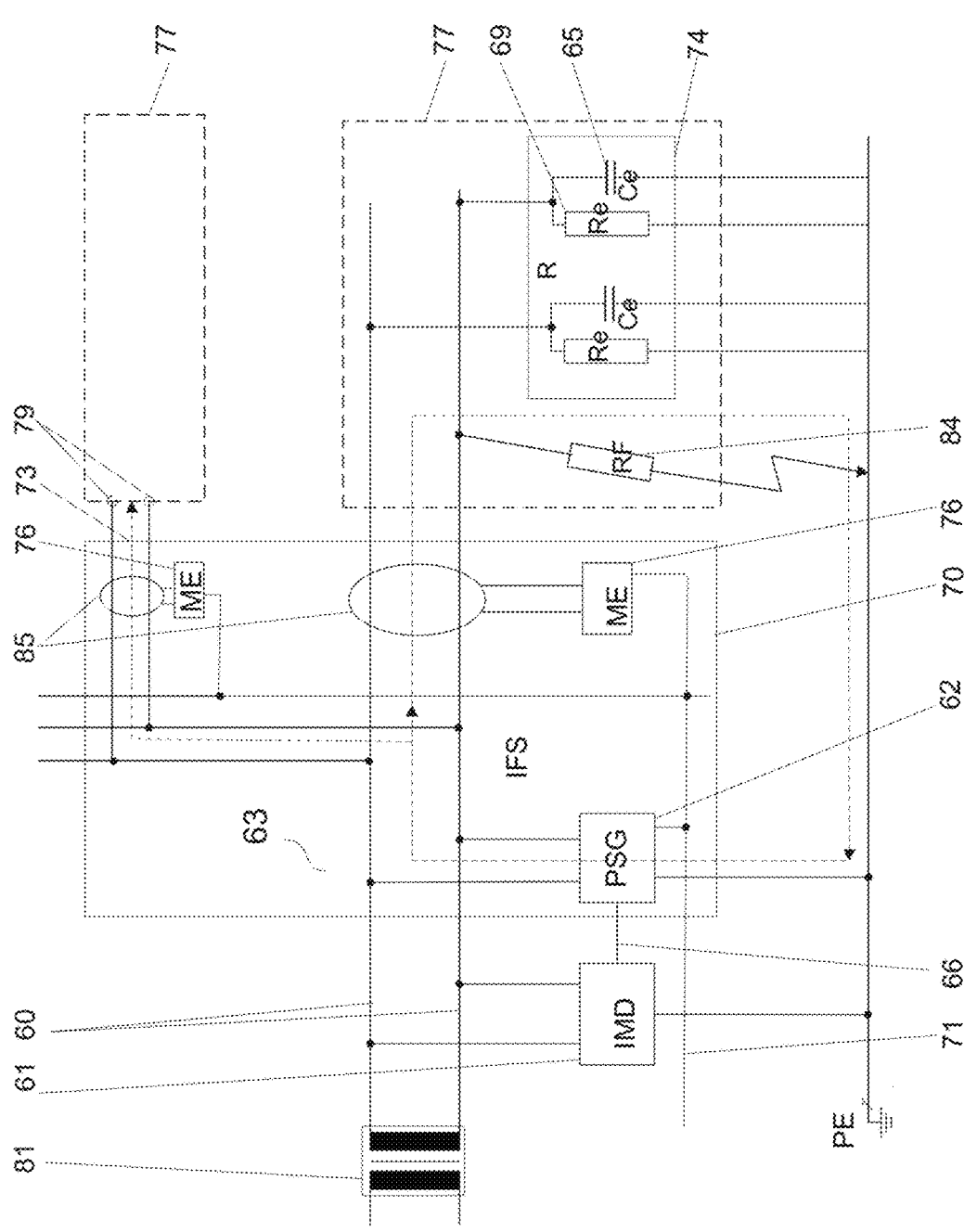

METHOD AND DEVICE FOR INSULATION MONITORING AND INSULATION FAULT LOCATION FOR UNEARTHED POWER SUPPLY NETWORKS

CROSS-REFERENCE TO RELATED APPLICATIONS

Not Applicable.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF MATERIAL SUBMITTED ON A READ-ONLY OPTICAL DISC, AS A TEXT FILE OR AN XML FILE VIA THE PATENT ELECTRONIC SYSTEM

Not Applicable.

STATEMENT REGARDING PRIOR DISCLOSURES BY THE INVENTOR OR A JOINT INVENTOR

Not Applicable.

BACKGROUND OF THE INVENTION

(1) Field of the Invention

The invention relates to a method and a device for insulation monitoring with an insulation monitoring device and insulation fault location without a testing current generator for unearthed electrical power supply networks, which can be a DC or AC voltage network.

(2) Description of Related Art Including Information Disclosed Under 37 CFR 1.97 and 1.98

Insulation monitoring devices (IMD) are used in unearthed power supply networks. These devices determine the insulation resistance $R_{iso}$ of the power supply network between all mains conductors and earth (PE). If the insulation resistance falls below an insulation resistance response value $R_{an}$, the insulation monitoring device detects an insulation fault in the supply network in the form of an error message. This first insulation fault should now be rectified as quickly as possible, as a second insulation fault can cause fuses to blow, resulting in a supply failure and loss of protective measures.

The insulation fault location system is intended to speed up fault elimination by quickly localising the faulty mains outgoing circuit. Common insulation fault location systems consist of a testing current generator close to the transformer and insulation fault locators with testing current sensors in the means circuits to detect the testing current generated by the testing current generator. The insulation fault location system starts when the insulation monitoring device reports an insulation fault. The testing current generator generates a testing voltage and feeds a testing current between the mains conductor and earth (PE) into the supply network. The test circuit is closed via the insulation fault. The insulation fault locator (IFS) recognises in which means outgoing circuit the testing current is flowing and signals the fault accordingly.

Insulation monitoring and insulation fault location are two separate processes in the state of the art. The testing system's testing current generator may only be activated if an insulation fault is present in the power supply network. Otherwise, an impermissibly high testing voltage ($U_L$) forms between the power supply network and earth (PE). This is due to the design of the testing current generators. As a rule, they contain a constant current source to generate the testing current ($I_L$). The current source is supplied from the mains voltage itself. The maximum testing voltage or open-circuit voltage of the testing current generator therefore corresponds to the peak value of the mains voltage. If there is an insulation fault in the power supply network, the testing current generator no longer operates in open circuit. This results in a testing voltage of $U_L = R_{iso} * I_L$.

With an insulation monitoring device, however, there is no risk of the test or measuring voltage ($U_m$) being too high. These devices use a constant voltage source with $U_q \leq 25$ V, which is connected to the mains conductors via coupling resistors ($R_i$). The maximum measuring voltage ($U_{m,max}$) between the power supply network and earth (PE) is always $U_{m,max} \leq U_q$. Due to this design, however, the measuring current in a mains outgoing circuit with $I_m \leq U_q/R_i$ is so small that it cannot be detected by the insulation fault locator. It cannot currently be used as a testing current for an insulation fault location system.

DE 10 2004 018 918 B3 discloses a method and a device for insulation fault location in unearthed electrical power supply networks with an insulation monitoring device and a testing current generator for generating a testing current that can be measured in the mains outgoing circuits in the event of mains faults. If the insulation resistance for the entire power supply network falls below a certain value, a testing current generator is activated by the insulation monitoring device, which generates a testing current between the power supply network and earth within a minimum test pulse time by means of a testing voltage that is specific to the system, and this current is detected and analysed in each mains outgoing circuit via current transformers, thereby localising the faulty mains outgoing circuit. The disadvantages are possible measurement errors due to unbalances between the mains and testing voltage and measurement errors due to a lack of differentiation between capacitive and resistive testing current as well as risks due to high testing voltages of approx. 300 V of the testing current generator, which are current-limited and therefore require at least additional protective measures.

In addition, the current transformers have tolerances, particularly in the inductance of the resistance of the secondary current transformer winding, which are an additional cause of measurement inaccuracies. A further disadvantage is that the two processes of insulation monitoring and insulation fault location take place one after the other and therefore separately.

Equivalent solutions with the same disadvantages are known from DE 10 2005 054 544 B4 and DE 20 2005 018 741 U1.

EP 2 664 932 B1 contains a further proposal for optimising insulation monitoring and insulation fault location with a testing current generator (PSG). An activated testing current generator (PSG) constantly measures the insulation resistance of the entire network $R_{iso}$ and can regulate its testing current $I_L$ in such a way that no excessively high testing voltage $U_L$ occurs after $U_L=R_{iso}*I_L$. If the measured $R_{iso}$ increases, the testing current generator recognises this and can automatically reduce the testing current. In extreme cases, where the insulation fault suddenly disappears completely, the testing current generator can also detect this using this method and switch itself off. The insulation monitoring device (IMD) then takes over the measurement of $R_{iso}$ again until the next insulation fault. In addition to limiting the testing voltage, this solution offers the advantage that insulation measurement and insulation fault location are merged into one process, at least when an insulation fault occurs. Current values for the insulation resistance $R_{iso}$ of the power supply network are constantly available. The system can quickly recognise status changes in the power supply network, which greatly speeds up the search for the cause. In the medical sector, mains plugs are usually pulled or cleaning fluids are wiped away, with immediate feedback. If the insulation monitoring device (IMD) had to be reactivated after each search process, the response time of the entire network would be long.

A disadvantage of the state of the art is that a separate testing current generator (PSG) is required for insulation fault location. This is necessary because the low measuring voltage of approx. 20 V of the insulation monitoring device (IMD) in accordance with the applicable regulations for unearthed power supply networks results in a low measuring current, which is distributed in branched power supply networks and is therefore much lower in the mains circuits and cannot currently be detected. In the medical sector, the testing current generators (PSG) generate a testing current $I_L$ of 1 mA. This current is approximately 20 times greater than the measuring current $I_m$ of an insulation monitoring device (IMD).

Another disadvantage of all known insulation monitoring and insulation fault location systems for unearthed power supply networks is that only one network is active at any one time. When the insulation monitoring device is active, the testing current generator is switched off and vice versa.

BRIEF SUMMARY OF THE INVENTION

The present invention is based on the task of proposing a method and a device for insulation monitoring and insulation fault location in branched unearthed electrical power supply networks without a testing current generator, whereby both networks enable reliable and permanent insulation monitoring, localisation and analysis of insulation resistances and faults per mains circuit on a continuous and error-free basis with low economic expenditure.

The solution to the technical problem includes a device and a method that permanently records the measuring current of the insulation monitoring device (IMD) for insulation fault location and insulation monitoring remains active during insulation fault location, so that insulation monitoring and insulation fault location merge into one process and insulation fault location is also extended to continuous complex resistive insulation monitoring of each mains outgoing circuit.

This task is solved in a first aspect of the present invention by a method for insulation monitoring and insulation fault location for unearthed power supply networks without a testing current generator, comprising A) providing a permanent measuring voltage between the mains conductor (60) and earth (80) and feeding in a measuring current by means of an insulation monitoring device (61), B) determining the measuring currents by means of at least one current transformer (64) arranged at each mains outgoing circuit (79), characterised in that the method further comprises C) determining the total measuring current and the proportional measuring currents in the mains outgoing circuits (79) by means of an insulation monitoring device (61), D) evaluating the measuring currents detected, wherein E) the measuring current of the insulation monitoring of the entire network is also used for insulation fault location in the individual circuits of the network, and F) the ohmic insulation resistance (69) and the capacitive reactance (65) of each mains outgoing circuit (79) are determined and analysed from the variation over time of the measuring current of each current transformer (64) and the measuring voltage of the insulation monitoring device (61).

The above task is solved in a further, alternative aspect of the present invention by a method for insulation monitoring and insulation fault location for isolated unearthed power supply networks without a testing current generator, comprising a. providing a constant measuring voltage between the mains conductor (60) and earth (80) and feeding a measuring current via the constant measuring voltage by means of an insulation monitoring device (61), characterised in that the method further comprises b. determining the measuring currents by means of at least one current transformer (86) arranged at each mains outgoing circuit (79) and the measuring current of a further current transformer (88) arranged centrally at the infeed of the power supply network (63) between the insulation monitoring device (61) and the first mains outgoing circuit (79) for recording over time the course of the fed-in measuring current of the insulation monitoring device (61) and the proportional measuring currents of the insulation monitoring device (61) at the mains outgoing circuits (79), c. evaluation of the detected measuring currents, whereby d the measuring current of the insulation monitoring device of the entire network is also used for insulation fault location in the individual circuits of the network, e. the ohmic insulation resistance (69) and the capacitive reactance (65) of each mains outgoing circuit (79) are determined and analysed from the time characteristic of the measuring current of each current transformer (64) and the measuring voltage of the insulation monitoring device (61), and f. the sum of the detected measuring currents and/or insulation resistances of all power supply outgoing circuits is compared with the detected measuring current and/or insulation resistance at the infeed and, in the event of a deviation, a correction of the fed-in measuring current and/or an error message is issued.

The method according to the invention has a number of advantages over the prior art. The hardware required for the method is greatly reduced and the waste heat from the testing current generator is eliminated. The insulation fault is also localised more quickly. As soon as the insulation monitoring device (61) responds, localisation is also complete. There is also no need to adapt the test signal of the insulation fault location system to the network conditions, because once the insulation monitoring device (61) has adapted, the location system has also adapted. The elimination of the testing current generator also eliminates its safety measures against excessive testing current in the event of component faults. Finally, the development of the search system is less expensive because the standardised tests of the test generator are no longer required. This makes the system cheaper.

The aforementioned task is solved in a second aspect of the present invention by a device for insulation monitoring and insulation fault location for unearthed power supply networks without a testing current generator, comprising an insulation monitoring device (61) at a central point of the supply network, wherein the insulation monitoring device (61) is designed to generate a permanent measuring voltage between the mains conductor (60) and earth (80) and to feed in a measuring current, characterised in that the device further comprises at least one current transformer (64) arranged in each mains outgoing circuit (79) centrally at the infeed of the power supply network (63) between the insulation monitoring device (61) and the first mains outgoing circuit (79), which is designed for the temporal recording of the course of the fed-in measuring current of the insulation monitoring device (61) and the proportional measuring currents of the insulation monitoring device (61) at the mains outgoing circuits (79) when the transformer (81) is switched on or off, at least one evaluation device for evaluating the measuring currents detected, wherein the measuring current of the insulation monitoring of the overall network can also be used for insulation fault location in the individual circuits of the network, and the measuring current of each current transformer (64) and the measuring voltage of the insulation monitoring device (61) can be used to determine and analyse the ohmic insulation resistance (69) and the capacitive reactance (65) of each mains outgoing circuit (79) over time.

According to the present invention, the transformer (81) of the IT network is regarded as the "central point" or "electrically central point". In order to be able to measure the measuring currents at the outgoing circuits with a current transformer (64), a measuring current must be fed in there. The measuring current fed in at the "central point" is distributed from there to the outgoing circuits according to the current divider rule.

The above task is solved in a further, alternative aspect of the present invention by a device for insulation monitoring and insulation fault location for isolated unearthed power supply networks without a testing current generator, comprising a. an insulation monitoring device at a central point of the supply network, wherein the insulation monitoring device generates a constant measuring voltage between the mains conductor (60) and earth (80) and feeds in a measuring current via the constant measuring voltage, characterised in that b. the device further comprises at least one current transformer (86) arranged in each mains outgoing circuit (79) and a further current transformer (88) arranged centrally at the infeed of the power supply network (63) between the insulation monitoring device (61) and the first network outgoing circuit for the temporal detection of the course of the fed-in measuring current of the insulation monitoring device (61) and the proportional measuring currents of the insulation monitoring device (61) at the network outgoing circuits when the transformer (81) is switched on or off, c. at least one evaluation device, preferably a microcontroller, for evaluating the measuring currents detected, wherein d. the measuring current of the insulation monitoring of the entire network is also used for insulation fault location in the individual circuits of the network, and e. the measuring current of each current transformer (64) and the measured voltage of the insulation monitoring device (61) are used to determine and analyse the ohmic insulation resistance (69) and the capacitive reactance (65) of each mains outgoing circuit (79) over time, and f. the sum of the detected measuring currents and/or insulation resistances of all power supply outgoing circuits is compared with the detected measuring current and/or insulation resistance at the infeed and, in the event of a deviation, a correction of the fed-in measuring current and/or error message is carried out.

The device according to the invention basically has the same advantages over the prior art as the method according to the invention. In addition, the partial resistances can be calculated from the total measuring current and the partial currents in the outlets:

$$R_{iso}1 = I_m/I_m1 * R_{iso}$$

$$R_{iso}2 = I_m/I_m2 * R_{iso}$$

If complex current values are available instead of the above amounts, impedances can be calculated:

$$Z_{iso}1 = I_m/I_m1 * Z_{iso}$$

$$Z_{iso}2 = I_m/I_m2 * Z_{iso}$$

The further embodiments mentioned below can be realised in combination with one another or individually. If process features are mentioned in the description of the device according to the invention, these refer in particular to the process according to the invention. Similarly, the features mentioned in the description of the method according to the invention refer to the device according to the invention.

An advantageous further development of the method according to the invention is that it further comprises one or more of the sub-steps:

pre-magnetising the current transformer core, reducing high-frequency interference on the measurement electronics, using low-noise operational amplifiers in the measurement electronics, providing a high-pass function to suppress low-frequency noise, bandwidth reduction to reduce the influence of noise on the measuring current detection (10).

This further development makes it possible in particular to measure very low currents by improving the ratio of useful signal to interference signal (i.e. noise).

In one embodiment of the method according to the invention, insulation monitoring and insulation fault location run simultaneously. Due to the parallelism, the search system works faster. In the prior art, the insulation monitoring device (61) runs first and then the test begins with the search system.

A further development of the method according to the invention provides for insulation monitoring and insulation fault location to take place when the transformer (81) is switched on or switched off. Previously, the transformers (81) could not be switched off because the testing current generator was dependent on the mains voltage. Now it is possible to save the no-load power of the transformer (81), e.g. at night.

In a further embodiment according to the invention, the measuring current detection (10) is performed by at least one correlation of the sampled values of the measuring current. The correlation with a sinusoidal signal is automatically frequency-selective, i.e. leads to the required bandwidth reduction for the purpose of noise suppression.

In a further embodiment according to the invention, the correlation of the sampled values of the measuring current is carried out by means of a sinusoidal oscillation whose frequency corresponds to the measuring voltage frequency ($f_m$) of the insulation monitoring system. The correlation with a sinusoidal signal is automatically frequency-selective, i.e. leads to the required bandwidth reduction for the purpose of noise suppression. Would contract the sections.

In a further embodiment according to the invention, the measuring current (10) is detected by at least two correlations of the sampled values of the measuring current, preferably each with a cosine and a sine oscillation. In particular, the two correlations of the sampled values of the measuring current can be synchronised so that a complex value of the measuring current is determined, the angle of which is related to the measuring voltage. If complex current values are available, the individual impedances of the outputs can be calculated so that the resistive and capacitive currents are obtained individually.

Another further development of the method according to the invention provides that the ohmic insulation resistance (69) and the capacitive reactance (65) and/or the impedance (67) of each mains outgoing circuit (79) is determined from the ratio of the measuring current of the insulation monitoring device (61) and the measuring current of the current transformer (64) of the mains outgoing circuit (79) multiplied by the insulation resistance (74) and/or the impedance (67) from the measured voltage and measuring current of the insulation monitoring device (61) and via square modulation.

The method according to the invention can also be implemented in such a way that the ohmic insulation resistance (69) and the capacitive reactance (65) and/or the impedance (67) of each mains outgoing circuit (79) are calculated using the current divider rule (which describes how the partial currents of a parallel connection of resistors can be calculated for a given total current) from the ratio of the individual measuring currents to the total measuring current.

The method of insulation monitoring and insulation fault location of insulation faults in the mains outgoing circuits (79) can be carried out continuously when the ohmic insulation fault is exceeded in the switched-on and switched-off state of the transformer (81).

For insulation fault location systems, it is advantageous to use a current with the lowest possible frequency. This results in a favourable ratio between the resistive current component that flows via the insulation fault and the capacitive component that flows via the network leakage capacitances. However, a low lower cut-off frequency of the insulation fault locator is opposed by current measurement using a current transformer (64). Induction requires the highest possible dI/dt, which in turn favours high frequencies.

In a further embodiment of the method according to the invention, the copper resistance (91) $R_{cu}$ of the secondary coil (1) in the secondary circuit (2) of the current transformer (64) is compensated by a negative resistance $R_{ges}$, since $R_{Cu} \sim R_{ges}$ applies.

In a further embodiment according to the invention, the differential inductance ($L_s$) of the secondary coil (1) of the current transformer (64) can be increased by premagnetising (93) the core.

These last two embodiments lead to a reduction in the cut-off frequency of the secondary circuit (2) of the current transformer (64).

In a further embodiment according to the invention, it is proposed to demagnetise the core of the secondary coil (1) of the current transformer (64).

This produces a defined state of the current transformer core(s), which have a certain remanence despite their soft magnetic behaviour. For measuring current detection (10), this has the advantage that a maximum differential inductance $L_s$ is achieved. A premagnetisation source (5) can be used for this purpose.

In a further embodiment according to the invention, the differential inductance $L_s$ of the secondary coil (1) of the current transformer (64) is determined by measuring the impedance (67) of the secondary circuit (2). By measuring the differential inductance $L_s$, the influence of temperature, ageing, magnetisation state and specimen scattering on the calculation of the insulation impedance can be eliminated.

In a further embodiment according to the invention, the measuring currents can be analysed at a central point, preferably using a microcontroller or software. For this purpose, the values of the measuring currents are transmitted to the central point via suitable communication media, for example bus systems.

In a decentralised evaluation, for example in the complex measuring electronics (76), it would be necessary to transmit the measured value of the measuring current of the first current transformer (64) to the other evaluation units and then only pass the values on to the central unit in the event of a fault.

The sensitivity of an insulation fault locator is limited by its background noise. If the useful signal is too low, it is lost in the noise. To improve the insulation fault locator in this respect, noise sources must be eliminated and the sensitivity of the current detection for the remaining residual noise must be reduced. The following measures, alone or in combination, lead to the goal:

The bias voltage used or the magnetising current flowing overcomes the remanence of the iron core of the current transformer (64). The Weiß districts are constantly kept in motion and therefore tend to align themselves very easily with a flowing primary current. This manifests itself as the desired increase in the differential inductance of the coil. However, the magnetic Barkhausen effect occurs during constant remagnetisation. This causes a disturbing noise component to appear in the magnetisation current. To reduce this, a very soft magnetic core can be used and, in return, the premagnetisation current can be reduced.

If high-frequency signals are coupled into an amplifier circuit, they are demodulated at non-linearities, e.g. the semiconductors of an operational amplifier. The offset voltage of an operational amplifier, for example, changes depending on the amplitude of the high frequency. This random interference can be regarded as a further source of noise.

Low-noise operational amplifiers are used in the measuring amplifier (3). Bipolar OPVs with a low input noise voltage are particularly suitable here.

The temperature dependence of various components of the measuring amplifier (3) provides a further source of noise. However, as temperature changes in components are slow processes, the spectral noise density is only high at very low frequencies. As a countermeasure, it is therefore sufficient to set the lower cut-off frequency of the measuring electronics (76) and especially of the transformer secondary circuit only as low as necessary for the measurement. The high-pass function of the secondary circuit filters out the noise of the low frequencies with the highest possible cut-off frequency.

The interfering influence of all noise sources on the testing current detection can be reduced by bandwidth reduction. The noise at the output of the measuring amplifier (3) is characterised by a spectral noise voltage density $u^2(f)$. If you want to determine the total effective value of the noise voltage, you integrate $u^2(f)$ over the frequency range of interest of the measuring amplifier (3), i.e. from its lowest to its highest cut-off frequency. The solution is therefore to reduce the bandwidth of the signal processing downstream of the measuring amplifier (3). A selective bandpass filter, which is precisely tuned to the frequency range of interest of the current, effectively suppresses the residual noise of the measuring electronics (76).

The insulation fault location system according to the invention operates without a testing current generator and directly utilises the measuring current of approx. 50 μA emitted by the insulation monitoring device (61) (IMD) for insulation fault location.

In a further embodiment, the ohmic insulation resistance (69) and the capacitive reactance (65) and/or the impedance (67) of each mains outgoing circuit (79) are determined from the ratio of the measuring current of the insulation monitoring device (61) and the detected measuring current of the current transformer (64) of the mains outgoing circuit (79) multiplied by the insulation resistance (74) and/or the impedance (67) from the measuring voltage and measuring current of the insulation monitoring device (61).

In a further alternative embodiment, the ohmic insulation resistance (69) and the capacitive reactance and/or the impedance (67) of each mains outgoing circuit (79) are determined from the ratio of the measuring current of the insulation monitoring device (61) and the detected measuring current of the current transformer (64) of the mains outgoing circuit (79) multiplied by the insulation resistance (74) and/or the impedance (67) from the measured voltage and measuring current of the insulation monitoring device (61) and via square modulation.

In a further embodiment, the calculation of the total resistance of the insulation monitoring device (61) $R_{iso}=U_m/I_m$ from the measured voltage and measuring current can be extended to the final circuits because the partial currents $I_{m1}$, $I_{m2}$, . . . are now available. In medical applications with comparatively low leakage capacitances, the current divider rule with real values can be used as an approximation to determine the insulation resistances per final circuit. The insulation resistances of the individual final circuits are calculated as i=1, 2, 3, . . . :

$$R_{iso,i}=I_m/I_{m,i}*R_{iso} \text{ mit } i=1,2,3, \qquad \text{(Eq. 1)}$$

and if complex current values are available, impedances (67) can be calculated:

$$Z_{iso,i}=I_m/I_{m,i}*Z_{iso} \text{ mit } i=1,2,3 \qquad \text{(Eq. 2)}$$

In order to be able to calculate the insulation resistance (74) $R_{iso}$ of the entire network, it is recommended that an insulation monitoring device (61) adapts to the network conditions. When its measuring current is applied between the network and earth (80) (PE), the network leakage capacitances are initially charged. Only when this equalisation process has been completed are valid final values of measuring current and measuring voltage available for the calculation $R_{iso}=U_m/I_m$. If a testing current generator is used, the insulation fault location system in the state of the art must also carry out a system adjustment, see EP 3 139 188 B1. Without a testing current generator, a separate adaptation of the insulation fault location system is no longer necessary. As soon as the insulation monitoring device (61) has adapted itself, the insulation fault location system also functions automatically.

The measuring voltage source of insulation monitoring devices IMD often emits a square-wave AC voltage. The measuring voltage is applied between the network and earth (80) (PE) via the coupling resistors. The frequency of the measuring voltage ($f_m$) is usually selected so low that there is sufficient time to charge the network leakage capacitance via the coupling resistors. A multiple of the time constant of the transient process is often used as the duration of the half-oscillation. The time constant is measured continuously and thus the frequency of the measuring voltage ($f_m$) is adapted to the grid conditions. This method is described in DE 101 06 200 C1.

For the proposed search system, it is preferably essential that a simple alternating current of constant frequency is produced as the measuring current after the insulation monitoring device IMD has been adapted to the system, the fundamental oscillation of which can be filtered in narrowband and then detected. In a preferred embodiment, filtering and detection are realised in one step. This is done by correlating the sampled values of the measuring current with a sinusoidal oscillation whose frequency corresponds to the measuring voltage frequency $f_m$ of the insulation monitoring device IMD. The more measuring signal periods are included in the correlation, the lower the bandwidth of the detection. The correlation can be realised in the form of an FIR filter (digital signal processing) of normal form 1, where the filter coefficients are simply replaced by the function values of the sinusoidal oscillation. A new correlation result is available with each new sampled value. The disadvantage is that the sampled values of the measuring current slide past the fixed sinusoidal oscillation. If the fundamental oscillation of the measuring current and the sine wave are in phase, the correlation result is maximised. At 90° phase shift it becomes zero. Periodically fluctuating values are obtained for the measuring current. This can be remedied by a second, similar correlation with a cosine function. Both correlation results can then be added together using the Pythagorean theorem to obtain an amount that is independent of the phase shift.

In a further embodiment, the sine and cosine functions for the two correlators are not fixed, but are synchronised with the measuring voltage of the insulation monitoring device IMD. The measuring current and the two angle functions are therefore phase-locked to each other at the correlators. The behaviour is similar to that of a quadrature demodulator (33). The fundamental oscillation of the measuring current is split into a cosine and a sine component. Using this method, the measuring current is available as a complex value and the impedance calculation mentioned above can be carried out. As a result, not only the ohmic insulation resistances (69) in the final circuits are known, but also the associated leakage capacitances. In this configuration, the phase shift between the fundamental oscillations of the measured voltage and measuring current of the insulation monitoring device IMD must be taken into account. The network leakage capacitance, coupling resistance and insulation resistance (74) of the entire network have an effect here. The phase shift of the measuring electronics (76) of the locating device must also be taken into account.

The measuring current acts as the primary current at the current transformer (64) of a locating device. The current induced in the secondary circuit shows a high-pass behaviour in relation to the primary current. The high-pass function is determined by the total ohmic resistance $R_{ges}$ and the differential inductance of the secondary coil (1) $L_s$. The differential inductance of the secondary coil (1) $L_s$ is subject to strong copy scattering and is also dependent on the magnetisation state of the transformer core. This means that the behaviour of the high-pass filter also scatters strongly, which makes its amplitude response, but especially its phase response, unpredictable. This reduces the accuracy of the proposed impedance calculation. In a further embodiment, $L_s$ is therefore determined during operation of the search device. According to DE 10 2005 054 544 B4, the secondary circuit (2) already contains a voltage coupling via which an analysis voltage $U_a$ can be coupled into the circuit in addition to other signals. The impedance (67) $Z_s$ of the series connection of $R_{ges}$ and $L_s$ determines the analysing current $I_a$ and can be calculated as $Z_s = U_a/I_a$. Ls is then obtained from the imaginary part of $Z_s$. It is advantageous to select an integer multiple of the frequency of the measuring voltage $f_m$ for the frequency $f_a$ of the analysis voltage. As a result, the correlators of the measuring current detection (10) provide the result zero for the analysing current. The analysing current therefore does not interfere with the measuring current detection (10) of the search unit.

The main advantages of the method according to the invention and the device according to the invention over the prior art are as follows:

Elimination of the testing current generator (62): Whereas in the prior art, the insulation monitoring device (61) must first be stopped and then the testing current generator (62) can only be started, fault location is now already completed when the insulation monitoring device (61) reports the insulation fault.

Fast and direct measuring method with significantly lower measuring voltage of, for example, approx. 20 V and very low and therefore harmless measuring currents of less than 1 mA, preferably less than 500 µA, particularly preferably less than 100 µA, especially preferably of approx. 50 µA compared to approx. 300 V and approx. 1 mA when using the testing current generator (62) for insulation fault location, so that the proportionate measured measuring currents by means of the current transformers (64) are less than 0.2 mA, particularly preferably less than 0.05 mA and approx. 7 µA.

Functionality is also guaranteed when the mains conductor is de-energised, i.e. when the power supply is switched on and off.

Comprehensive and permanent information on the quality of the power supply network and its consumers.

No heat dissipation problems that arise when generating a testing current with linear current regulators.

Although the testing current generator (62) is generally no longer a separate device for switch cabinet installation according to the state of the art, it exists as a circuit component, for example in insulation detectors or in combined devices for insulation monitoring and insulation fault location. There it causes additional component costs. Even more serious, however, is its space requirement on the circuit boards. Due to the coupling of the generator circuit to the mains, fail-safe insulation with appropriate clearances and creepage distances must be provided to touchable parts of the device electronics and to earth (80) (PE). Testing current generators must not generate excessive testing current, even in the event of component faults. This requirement is met by the high and fail-safe coupling resistances of the insulation monitoring without additional measures. In general, the standardised testing effort for an insulation fault location system is greatly reduced if the testing current generator is omitted. The conformity of the insulation monitoring system is already sufficient. This ultimately leads to a price saving when using detection systems according to the invention.

Further objectives, features, advantages and possible applications are shown in the following description of non-limiting embodiments of the invention with reference to the figures. All the features described and/or illustrated form the object of the invention, either individually or in any combination, even independently of their summary in the claims or their relationship to one another. The figures show

BRIEF DESCRIPTION OF THE SEVERAL VIEWS OF THE DRAWING(S)

Figure 2:
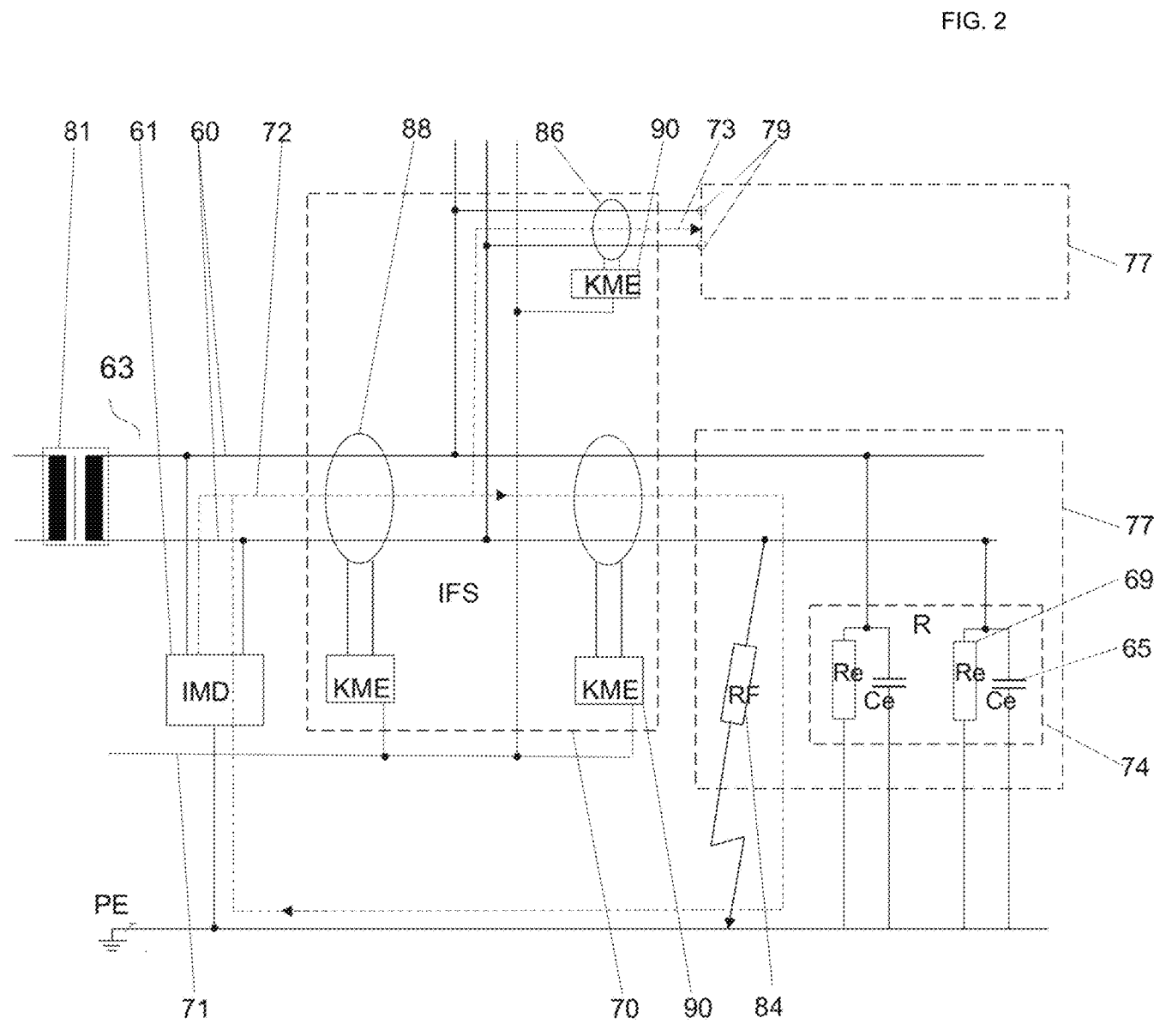
Figure 3:
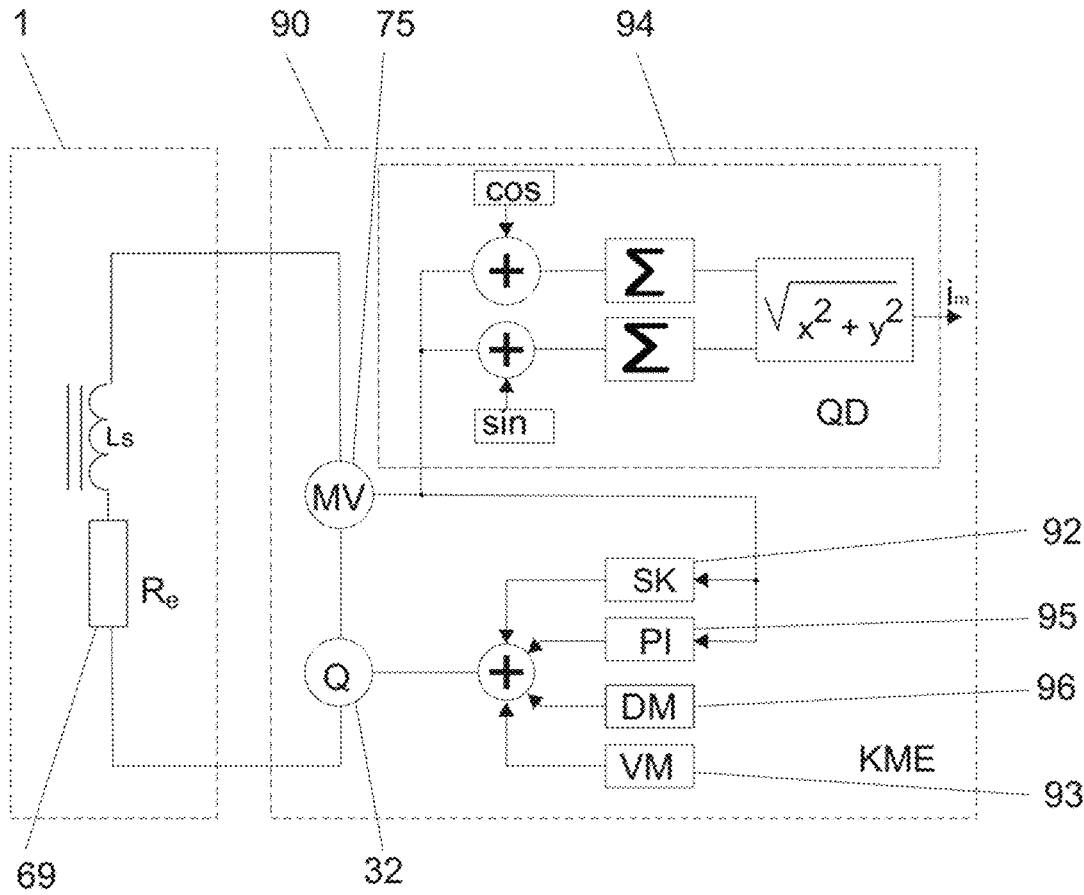
Figure 5:
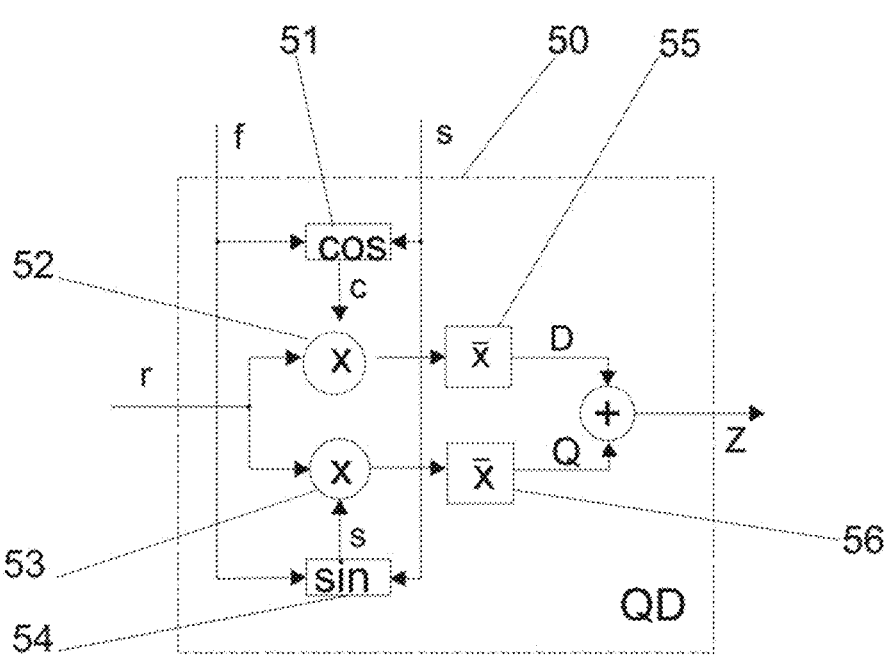
Figure 4:
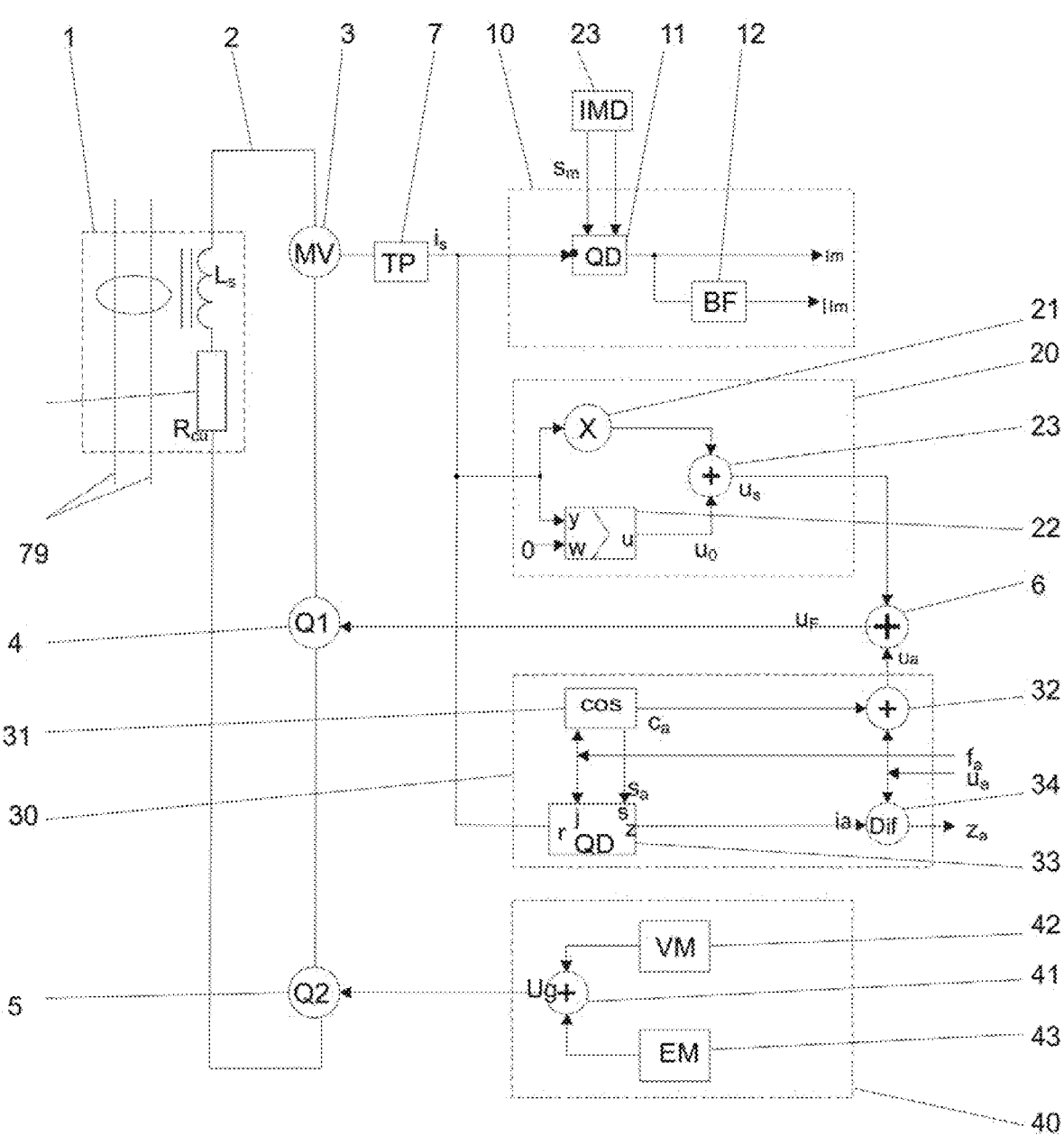

FIG. 1 a device and method for insulation monitoring and insulation fault location according to the prior art, FIG. 2 a device and method for insulation monitoring and insulation fault location according to a preferred embodiment of the present invention, FIG. 3 a first block diagram of the signal flow diagram of the method according to the invention in a preferred embodiment, FIG. 4 a second block diagram of the signal flow diagram of the method according to the invention in a preferred embodiment, and FIG. 5 a third block diagram of the signal flow diagram for correlative detection of the measuring current via square modulation.

DETAILED DESCRIPTION OF THE INVENTION

In the figures, all identical components are named with the same reference symbols, but for reasons of clarity, not all reference symbols are included in all illustrations.

FIG. 1 shows the state of the art of insulation monitoring and insulation fault location in unearthed power supply networks. An insulation monitoring device IMD generates a low measuring voltage via a constant voltage source, which feeds a low measuring current into the unearthed power supply network 63 between the mains conductors 60 and earth 80 PE, and uses this to determine and monitor the total insulation resistance 74 $R_{iso}$ of the power supply network. If the insulation resistance falls below a response value $R_{an}$, the insulation monitoring device IMD 61 generates an error message and the insulation fault location system IFS, consisting of testing current generator PSG 62, current sensors 85 and measuring electronics ME 76, is started by activating the testing current generator PSG 62 via a connection 66. The testing current generator 62 generates a higher testing voltage from the mains voltage than the measuring voltage of the insulation monitoring device 61 and a higher testing current between the mains conductor 60 and earth 80 PE compared to the measuring current of the insulation monitoring device 61. The proportional testing current 73 is detected in the final circuits 77 via testing current sensors 85 and the respective insulation resistance 74 of the final circuit 77 is determined from this via the measuring electronics 76

ME. This insulation resistance 74 of the final circuit 77 is transmitted via bus lines 71 to the central signalling unit, which determines and localises the faulty final output. After the insulation fault has been eliminated on site, the insulation monitoring device IMD 61 is reactivated and the testing current generator PSG 62 is deactivated via the connection 66.

FIG. 2 shows the insulation monitoring and insulation fault location without testing current generator 62 PSG for an unearthed power supply network 63 according to the present invention with insulation monitoring device IMD 61, which continuously feeds a low measuring current into the unearthed power supply network 63 between mains conductor 60 and earth 80 PE via the measuring voltage. In the power network, the measuring current 88 and the proportional measuring current at each final circuit 77 are detected immediately after the insulation monitoring device IMD 61 via current sensors 86 and the complex measuring current electronics KME 90 uses this to determine the associated ohmic insulation resistance 69 and the capacitive reactance 65. The insulation fault location system is permanently in operation, even when transformer 81 is switched off, and as a result all ohmic insulation resistances 69 and capacitive reactances 65 are determined, localised, reported to a control centre via suitable communication media (bus systems) and evaluated.

FIG. 3 shows the signal flow diagram for the method according to the invention for insulation fault location via the secondary circuit of the current transformer 64, which is shown by means of the equivalent circuit diagram consisting of copper resistance 91 $R_{cu}$ of the winding and inductive resistance $L_s$. The current transformer 64 detects the measuring current, which determines the ohmic insulation resistance 69 and capacitive reactance 65 of the sub-network in the complex measuring current electronics 90 KME by amplifying it via measuring amplifier 3 and compensating for measuring errors and interference.

In the complex measuring electronics, a controllable voltage source can be used to the copper resistance 91 $R_{cu}$ of the secondary current transformer winding of the current transformer 64 can be compensated by means of variable negative resistance via a secondary control 92 SK, and/or the remanence of the core of the current transformer 64 can be eliminated via premagnetisation 93 Q, and/or the core of the differential current transformer can be demagnetised, and/or radio interference is compensated via equivalent primary noise current, the measuring current is detected at a variable operating point of the current transformer 64 by feeding in a variable voltage via premagnetisation 93 VM with minimal Barkhausen noise, which further reduces the noise level by bandwidth reduction via square modulator 94 QD with subsequent resistive magnitude formation, a distinction is made between resistive and capacitive measuring current by detecting and analysing a harmonic of the measuring current with phase angle in relation to the measuring voltage of the insulation monitoring device 61 via square modulation QM, or several harmonics of measuring voltage and are analysed, the impedance 67 of the secondary winding of the current transformer 64 is measured by feeding in a variable demagnetisation voltage DM, the zero-point adjustment of the secondary circuit of the current transformer 64 is performed via PI controller 95 with time-dependent parameters.

This makes it possible to record measuring currents of approx. 7 µA in the frequency range from 0.1 to 7.0 Hz.

FIG. 4 shows the signal processing for the method according to the invention. If time functions are involved, signals are labelled with lower case letters. Upper case letters indicate pointers or complex variables. The measuring amplifier 3 converts the flowing measuring current in the mains conductors 60 into the secondary current signal is. The controllable voltage sources 4, 5 convert voltage signals into voltages that couple into the secondary current circuit 2. The signal processing is usually digital. The low-pass filter 7 ensures compliance with the sampling theorem. It is also shown here because it causes a phase shift in the secondary current is, which must be taken into account when calculating impedance, for example.

The quadrature demodulator QD 11 of the measuring current detection 10 runs at the same frequency at which the insulation monitoring device IMD 61 generates its measuring voltage. The primary result of the measuring current detection 10 is the value of the measuring current $|I_m|$.

In a further embodiment, the quadrature demodulator QD 11 and insulation monitoring device IMD 61 are synchronised via the synchronisation signal sm. In this case, the complex measuring current ($I_m$) can be used for an impedance calculation.

The secondary circuit control 20 compensates the copper resistance 91 $R_{cu}$ of the secondary coil 1 and regulates the secondary current $i_s$ to 0; it outputs the voltage of the secondary circuit control 20 $u_s$. The resistance compensation 21 is realised by the multiplier 52, 53 with the factor-$R_{cu}$. The PI controller 95 receives the secondary current is as the reference variable and the value 0 as the setpoint. The offset voltage $u_o$ is the manipulated variable. The lower limit frequency of the secondary circuit can be set via the parameters of the PI controller 95. The highest possible cut-off frequency reduces the noise at low frequencies, which can be caused by temperature changes in secondary circuit 2.

Another embodiment is the secondary circuit analysis 30, which feeds an analysis voltage $u_a$ in cosine form with the amplitude $U_a$ into the secondary circuit 2. The QD 33 filters out the component with the analysis frequency $f_a$ from the secondary current is and supplies the complex analysis current $I_a$. The divider 34 calculates the impedance 67 $Z_a = U_a / I_a$. The $1^{st}$ cosine generator 31 synchronises the QD 33 via the synchronisation signal $s_a$. According to FIG. 4, $Z_a$ is the resulting impedance 67 of the secondary circuit 2, i.e. under the influence of the secondary circuit control 20. In order to obtain the pure coil data, the secondary circuit control 20 can be switched off during the analysis or its influence can be calculated out. The influence is a known variable.

The magnetisation control 40 contains the demagnetisation generator 43, which demagnetises the converter core at the start. The premagnetising generator 42 softens the transformer core with its signal during the measurement or measuring current detection 10. The output variable is the magnetisation voltage $u_g$.

FIG. 5 illustrates the processing of the quadrature demodulator QD. The $2^{nd}$ cosine generator 51 receives the frequency f to be generated as an input signal. When a synchronisation signal s arrives, the $2^{nd}$ cosine generator 51 jumps back to the phase angle 0 degrees. The signal output c of the $2^{nd}$ cosine generator 51 with the value range –1 to 1. The sine generator 54 works in the same way. The mean value calculation 55, 56 form the moving average over a certain time, which corresponds to a multiple N of the period duration of the signal generators. The multiple N is selected appropriately, e.g. N=3. A high N reduces the bandwidth of the QD, but extends the settling time of the averaging. Low bandwidth means low sensitivity to residual noise. If a cosine signal is present at the input r of the QD synchronised with the $2^{nd}$ cosine generator 51, D assumes the value 1 and Q assumes the value 0. The summing generator 57 forms the complex number Z=D+jQ.

LIST OF REFERENCE SYMBOLS

1 Equivalent circuit secondary coil
2 Secondary circuit
3 Measuring amplifier MV
4 Feedback source
5 Magnetisation source
6 Summator, feedback voltage uf
7 Low-pass bandwidth
10 Measuring current detection
11 Quadrature demodulator measuring current
12 Magnitude function |Im|
20 Secondary circuit control
21 Resistance compensation
22 Secondary current controller
30 Secondary circuit analysis
31 $1^{st}$ cosine generator
32 Totaliser
33 Quadrature demodulator analysis current
34 Divider-impedance calculation
40 Magnetisation control
42 Premagnetising generator
43 Demagnetising generator
50 Quadrature demodulator QD
51 $2^{nd}$ cosine generator
52 Multiplier
53 Multiplier
54 Sine generator
55 Moving average calculation
56 Moving average calculation
57 Summing generator that provides Z=D+jQ.
60 Mains conductor
61 Insulation monitoring device IMD
62 Testing current generator PSG
63 Power supply network
64 Current transformer
65 Capacitive reactance Ce
66 Connection
67 Impedance Z
68 Mains interference
69 Ohmic insulation resistance Re
70 Insulation fault location system IFS
71 Bus line
72 Measuring current $I_m$
73 IP testing current
74 Insulation resistance
76 ME measuring electronics
77 Final circuit
79 Mains outgoing circuit
80 Earth PE
81 Transformer
82 Measuring voltage
83 Testing voltage
84 Insulation fault RF
85 Testing current sensor
86 Measuring current sensor terminal device

87 Insulation resistance response value $R_{an}$
88 Central measuring current sensor
89 Plausibility check
90 Complex measuring current electronics KME
91 Copper resistance $R_{cu}$
92 Secondary control SK
93 Premagnetisation VM
94 Square modulator QD
95 PI controller PI
96 Variable demagnetisation voltage DEMAG

The invention claimed is:

1. A method for insulation monitoring and insulation fault location for unearthed power supply networks without a testing current generator, comprising
    A) providing a permanent measuring voltage between the mains conductor (60) and earth (80) and feeding in a measuring current by means of an insulation monitoring device (61),
    B) determining the measuring currents by means of at least one current transformer (64) arranged at each mains outgoing circuit (79),
    characterised in that the method further comprises
    C) determining the total measuring current and the proportional measuring currents in the mains outgoing circuits (79) by means of an insulation monitoring device (61),
    D) evaluating the measuring currents detected, wherein
    E) the measuring current of the insulation monitoring of the entire network is also used for insulation fault location in the individual circuits of the network, and
    F) the ohmic insulation resistance (69) and the capacitive reactance (65) of each mains outgoing circuit (79) are determined and analysed from the variation over time of the measuring current of each current transformer (64) and the measuring voltage of the insulation monitoring device (61).

2. The method according to claim 1, further comprising one or more of the substeps
    pre-magnetising the current transformer core,
    reducing high-frequency interference on the measurement electronics,
    using low-noise operational amplifiers in the measurement electronics,
    providing a high-pass function to suppress low-frequency noise,
    bandwidth reduction to reduce the influence of noise on the measuring current detection (10).

3. The method according to claim 1, wherein the insulation monitoring and the insulation fault location run simultaneously.

4. The method according to claim 1, wherein the insulation monitoring and the insulation fault location take place when the transformer (81) is switched on or switched off.

5. The method according to claim 1, wherein in the secondary circuit (2) of the current transformer (64) the copper resistance ($R_{cu}$) (91) of the secondary coil (1) is compensated by a negative resistance.

6. The method according to claim 1, wherein the measuring current detection (10) is performed by at least one correlation of the sampled values of the measuring current.

7. The method according to claim 6, wherein
    the correlations of the sampled values of the measuring current are carried out by means of a sinusoidal oscillation whose frequency corresponds to the measuring voltage frequency $f_m$ of the insulation monitoring,
    or the measuring current detection (10) is carried out by at least two correlations of the sampled values of the measuring current, preferably with a cosine and a sine oscillation, wherein the two correlations of the sampled values of the measuring current can be synchronised, and a complex value of the measuring current is determined, the angle of which is related to the measuring voltage.

8. The method according to claim 6, wherein the ohmic insulation resistance (69) and the capacitive reactance (65) and/or the impedance (67) of each mains outgoing circuit (79) are calculated from the ratio of the individual measuring currents to the total measuring current using the current divider rule.

9. The method according to claim 1, wherein the insulation monitoring and insulation fault detection of insulation faults in the mains outgoing circuit (79) are carried out permanently in the switched-on and switched-off state of the transformer (81).

10. The method according to claim 1, wherein the differential inductance ($L_s$) of the secondary coil (1) of the current transformer (64) is increased by a premagnetisation.

11. The method according to claim 1, wherein the current transformer core of the secondary coil (1) of the current transformer (64) is demagnetised.

12. The method according to claim 1, wherein the differential inductance ($L_s$) of the secondary coil (1) of the current transformer (64) is determined by measuring the impedance (65) of the secondary circuit (2).

13. The method according to claim 5, wherein a zero-point adjustment of the secondary circuit (2) of the differential current transformer and the compensation of the copper resistance ($R_{cu}$) (91) of the secondary coil (1) is performed by the same proportional-integral controller (95).

14. The method according to claim 1, wherein the evaluation of the measuring currents is carried out at a central point and the values of the measuring currents are transmitted to the central point via suitable communication media.

15. A device for insulation monitoring and insulation fault location for unearthed power supply networks without testing current generator, comprising an insulation monitoring device (61) at a central point of the supply network, wherein the insulation monitoring device (61) is designed to generate a permanent measuring voltage between the mains conductor (60) and earth (80) and to feed in a measuring current, characterised in that the device further comprises at least one current transformer (64) arranged in each mains outgoing circuit (79) centrally at the infeed of the power supply network (63) between the insulation monitoring device (61) and the first mains outgoing circuit (79), which is designed for the temporal recording of the course of the fed-in measuring current of the insulation monitoring device (61) and the proportional measuring currents of the insulation monitoring device (61) at the mains outgoing circuits (79) when the transformer (81) is switched on or off, at least one evaluation device for evaluating the measuring currents detected, wherein the measuring current of the insulation monitoring of the overall network can also be used for insulation fault location in the individual circuits of the network, and the measuring current of each current transformer (64) and the measuring voltage of the insulation monitoring device (61) can be used to determine and analyse the ohmic insulation resistance (69) and the capacitive reactance (65) of each mains outgoing circuit (79) over time.

\* \* \* \* \*